(12) United States Patent
Chiang et al.

(10) Patent No.: US 7,592,051 B2
(45) Date of Patent: Sep. 22, 2009

(54) NANOSTRUCTURED LOW-CR CU-CR COATINGS FOR HIGH TEMPERATURE OXIDATION RESISTANCE

(75) Inventors: Kuang-Tsan Kenneth Chiang, Helotes, TX (US); James H. Arps, San Antonio, TX (US); Ronghua Wei, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 26 days.

(21) Appl. No.: 11/054,665

(22) Filed: Feb. 9, 2005

(65) Prior Publication Data

US 2006/0177581 A1    Aug. 10, 2006

(51) Int. Cl.
*C23C 14/18* (2006.01)
(52) U.S. Cl. .................... 427/528; 427/250; 427/255.7
(58) Field of Classification Search ............. 427/255.7, 427/225.15, 255.21, 250, 528
See application file for complete search history.

(56) References Cited

U.S. PATENT DOCUMENTS

| | | | |
|---|---|---|---|
| 3,756,939 A | 9/1973 | Hurwitt | |
| 4,009,090 A | 2/1977 | Veigel | |
| 4,124,737 A | 11/1978 | Wolfa et al. | |
| 4,179,351 A | 12/1979 | Hawton, Jr. et al. | |
| 4,221,652 A | 9/1980 | Kuriyama | |
| 4,376,025 A | 3/1983 | Zega | |
| 4,407,713 A | 10/1983 | Zega | |
| 4,444,643 A | 4/1984 | Garrett | |
| 4,478,703 A | 10/1984 | Edamura | |
| 4,525,264 A | 6/1985 | Hoffman | |
| 4,818,359 A | 4/1989 | Jones et al. | |
| 4,960,753 A | 10/1990 | Collins et al. | |
| 5,015,493 A | 5/1991 | Gruen | |
| 5,096,562 A | 3/1992 | Boozenny et al. | |
| 5,272,735 A | 12/1993 | Bryan et al. | |
| 5,391,407 A | 2/1995 | Dearnaley | |
| 5,393,572 A | 2/1995 | Dearnaley | |
| 5,445,721 A | 8/1995 | Bower | |
| 5,501,745 A | 3/1996 | Dearnaley | |
| 5,556,713 A * | 9/1996 | Leverant ..................... 428/610 |

(Continued)

FOREIGN PATENT DOCUMENTS

GB    2125441    3/1983

(Continued)

OTHER PUBLICATIONS

Fu et al, Microstructural effects on the high temperature oxidation of two-phase Cu-Cr alloys in 1 atm O2, Corrosion Science 45 (2003) 559-574.*

(Continued)

*Primary Examiner*—Timothy H Meeks
*Assistant Examiner*—Elizabeth Burkhart
(74) *Attorney, Agent, or Firm*—Grossman, Tucker et al.

(57) ABSTRACT

This invention is directed to a method of preventing oxidation of copper alloys at high temperatures by deposition of a nano-structured, low-chromium copper-chromium protective coating to copper-alloy components. The coatings of the present invention are applied by an ion beam assisted, electron beam physical vapor deposition and consist of copper and chromium particles having a diameter of about 10 nm. This invention also encompasses the coated copper-alloy components produced by the disclosed deposition methods.

11 Claims, 13 Drawing Sheets

U.S. PATENT DOCUMENTS

| | | | |
|---|---|---|---|
| 5,557,927 | A | 9/1996 | Chiang et al. |
| 5,580,669 | A | 12/1996 | Beers et al. |
| 5,698,273 | A | 12/1997 | Azad et al. |
| 5,750,185 | A | 5/1998 | Goedicke et al. |
| 5,792,521 | A | 8/1998 | Wortman |
| 5,919,561 | A | 7/1999 | Fuchs et al. |
| 5,935,391 | A | 8/1999 | Nakahigashi et al. |
| 5,981,088 | A | 11/1999 | Bruce et al. |
| 5,997,957 | A | 12/1999 | Bertamini et al. |
| 6,040,067 | A | 3/2000 | Sugawara et al. |
| 6,060,175 | A | 5/2000 | Swisher |
| 6,063,435 | A | 5/2000 | Schulz et al. |
| 6,153,313 | A | 11/2000 | Rigney et al. |
| 6,200,649 | B1 | 3/2001 | Dearnaley |
| 6,277,499 | B1 | 8/2001 | Beers et al. |
| 6,291,084 | B1 | 9/2001 | Darolia et al. |
| 6,314,720 | B1 | 11/2001 | Holmes et al. |
| 6,338,777 | B1 | 1/2002 | White |
| 6,352,788 | B1 | 3/2002 | Bruce |
| 6,365,010 | B1 | 4/2002 | Hollars |
| 6,491,769 | B1 | 12/2002 | Smith et al. |
| 6,562,417 | B2 | 5/2003 | Suzuki et al. |
| 6,620,465 | B2 | 9/2003 | Rigney et al. |
| 6,767,436 | B2 | 7/2004 | Wei |
| 6,838,191 | B1 * | 1/2005 | Raj .......................... 428/675 |
| 6,905,579 | B2 | 6/2005 | Crowley |
| 2002/0122895 | A1 | 9/2002 | Cheong et al. |
| 2004/0151845 | A1 | 8/2004 | Nguyen et al. |
| 2004/0191436 | A1 | 9/2004 | Wei et al. |
| 2004/0258851 | A1 | 12/2004 | Selvamanickam et al. |
| 2005/0145488 | A1 | 7/2005 | Erbkamm et al. |
| 2005/0178662 | A1 | 8/2005 | Wurczinger |
| 2005/0224343 | A1 | 10/2005 | Newcomb et al. |

FOREIGN PATENT DOCUMENTS

| | | |
|---|---|---|
| JP | 59215484 | 12/1984 |
| JP | 04107268 | 4/1992 |
| JP | 05-230648 | 9/1993 |
| JP | 05230648 | 9/1993 |
| WO | WO 99/17307 | 4/1999 |

OTHER PUBLICATIONS

Chiang et al, Oxidation studies of Cu-Cr-coated Cu-Nb microcomposite, Surface and Coatings Technology 61 (1993) 20-24.*

Singh et al, An Overview: Electron Beam-Physical Vapor Deposition Technology- Present and Future Applications, Surface Engineering: Science and Technology I, 1999, p. 59-74.*

Thomas-Ogbuji, Protection of Advanced Copper Alloys With Lean Cu-Cr Coatings, NASA Technical Reports Server, http://gltrs.grc.nasa.gov/reports/2003/CR-2003-212548.pdf, Published Aug. 2003, p. 1-14.*

Ellis, et al., "Mechanical and Thermal Properties of Two Cu-Cr-Nb Alloys and NARloy-Z", NASA CR-198529 (Oct. 1996).

Chiang, et al., "Blanching Resistant Cu-Cr Coating by Vacuum Plasma Spray" 76-77 Surf. & Coatings Tech. (1995), pp. 14-19.

Chiang, et al., "Oxidation Studies of Cu-Cr Coated Cu-Nb Microcomposite", 61 Surf. & Coatings Tech (1993), pp. 20-23.

Chiang, et al., "Oxidation Kinetics of Cu-30vol.%Cr Coating", 78 Surf. & Coatings Tech. (1996), pp. 243-247.

Chiang, "Microstructure Analysis of Cu-Cr Coatings After High Temperature Oxidation", CNWRA:San Antonio, TX (2003).

Pyburn, et al., "Dwell Sensitivity Behavior of High Temperature Materials", Dept. of Mech. Eng., Arkansas Tech. Univ.

Prabhu, "Intelligent Automation of Electron Beam Physical Vapor Deposition Using LabVIEW", National Instruments Customer Solutions publication (2000).

Singh, et al., "Electron Beam Physical Vapor Deposition Technology: Present and Future Applications", arl.psu.edu/core/ebpvd/ebpvd.html.

Arps, "Ion Surface Engineering", www.swri.org/3pubs/brochure/d06/ionbeam/ionbeam.htm (Jan. 11, 2005).

Ellis, et al., "GRCop-84 Developed for Rocket Engines", www.lerc.nasa.gov/WWW/RT2000/5000/5100E-ellis.html (Jan. 17, 2005).

Musil et al., "Nanocrystalline and Nanocomposite CrCu and Cr-Cu-N films prepared by magnetron sputtering," Surface & coatings technology 1999, vol. 115, No. 1, pp. 32-37.

Seok, et al., "Sputter-deposited nanocrystalline Cr and CrN coatings on steels," Surface and Coatings Technology vol. 138, Issue 1, Apr. 2, 2001, pp. 14-22.

Baker et al., "Investigation of the nanostructure and wear properties of physical vapor deposited CrCuN nanocomposite coatings," J. Vac. Sci. Tech. A 23(3), May/Jun. 2005, pp. 423-433.

United States Office Action issued in related U.S. Appl. No. 10/962,772 dated Apr. 8, 2008.

United States Office Action issued in related U.S. Appl. No. 10/963,341 dated Jun. 4, 2008.

United States Notice of Allowance issued in related U.S. Appl. No. 10/963,341 dated Feb. 23, 2009.

United States Office Action issued in related U.S. Appl. No. 10/963,341 dated Jan. 31, 2008.

United States Office Action issued in related U.S. Appl. No. 10/963,341 dated Nov. 2, 2007.

United States Office Action issued in related U.S. Appl. No. 10/963,341 dated Jul. 6, 2007.

United States Office Action issued in related U.S. Appl. No. 10/963,341 dated Feb. 5, 2007.

United States Office Action issued in related U.S. Appl. No. 10/963,341 dated Nov. 20, 2006.

United States Office Action issued in related U.S. Appl. No. 10/963,341 dated Jul. 21, 2006.

Hosokawa et al, Selt-Sputtertng phenomena In hIgh-ratte coaxial cylindrical magnetron sputtering. J. Vac. Sci. Technol., Jan./Feb. 1977, 143-146, 14(1). American Vacuum Society.

Malik et al., "Development of an energetic ion assisted mixing and deposition process for TiNx and diamondlike carbon films, using a coaxial geometry in plasma source ion implantation," J. Vac. Sci. Tech. Nov./Dec. 1997, 2875-2879.

Ensinger, "An apparatus for sputter coating the inner walls of tubes," Rev. Sci. Instrum., Jan. 1996, 318-321, 67 (1), American Institute of Physics.

United States Office Action issued in related U.S. Appl. No. 11/397,878 dated Feb. 27, 2009.

United States Office Action issued in related U.S. Appl. No. 11/397,878 dated Sep. 29, 2008.

International Search Report and Written Opinion issued in related International Patent Application No. PCT/ US2005/24110 dated Jan. 31, 2006.

* cited by examiner

NANOSTRUCTURED LOW-CR CU-CR COATINGS FOR HIGH TEMPERATURE OXIDATION RESISTANCE

BACKGROUND OF THE INVENTION

Copper-based alloys and composites are candidate materials for high heat flux structural applications because of their high thermal conductivity and high-temperature strength. Such applications include hot gas walls for combustion chambers and surfaces of nozzle ramps for rocket engines and for the next generation launch vehicles. Other applications include protective coatings for heat exchangers in commercial power generation systems and firearm barrels.

Such applications for these type of services have employed many copper-based materials. Examples of copper-based materials include Cu—Ag—Zr, Cu—Be, Cu—Co—B, Cu—Cr, Cu—Cr—Al, Cu—Cr—Nb, Cu—Cr—Zr—Mg, Cu—Nb, Cu—Ni, Cu—Ta, Cu—Zr, and Cu—Zr—Ti alloys, and oxygen-free high conductivity (OFHC) copper. Since the 1970s, an alloy commonly referred to as NARLOY-Z (Cu-3 wt. % Ag-0.5 wt. % Zr) has been the predominantly chosen material for use in the high-temperature, oxidative environments present in certain rocket components, such as the space shuttle main engine (SSME). In recent years, however, GRCOP-84 (Cu-8 atom % Cr-4 atom % Nb), developed at the NASA Glenn Research Center, has become a candidate material for various high temperature applications due to its many superior properties, including thermal expansion, yield strength, and strength retention following simulated brazing. (See, e.g., Ellis, David L.; and Michal, Gary M.: Mechanical and Thermal Properties of Two Cu—Cr—Nb Alloys and NARloy-Z. NASA CR-198529, 1996).

A major limitation to the use of any of these copper-based materials, however, is their rapid oxidation at elevated temperatures. In addition, copper-alloy rocket engine combustion chamber linings have been found to deteriorate when exposed to cyclic reducing/oxidizing (redox) environments, which are a consequence of the combustion process. This deterioration, known as blanching, can be characterized by increased roughness and burn-through sites in the wall of the combustion chamber lining and can seriously reduce the operational lifetime of the combustion chamber.

An illustrative example of a copper alloy rocket engine combustion chamber that undergoes blanching is in the SSME propulsion system. A high pressure, high temperature rocket engine, the SSME burns a mixture of liquid oxygen and liquid hydrogen. During combustion, localized regions along the combustion chamber's wall lining become, alternatively, rich in oxygen (forming an oxidizing environment) and rich in hydrogen (forming a reducing environment). When a region of the combustion chamber's lining is exposed to an oxidizing environment, copper oxides form. Subsequently, when exposed to a reducing environment, these copper oxides are reduced. The result of cycling a region of the chamber wall between an oxidizing and reducing environment is to cause the wall lining to become scarred and rough. This, in turn, can result in localized hot spots that reduce the operational (i.e., useful) lifetime of the combustion chamber.

Oxidation resistance requirements for useful protective coatings vary for specific applications. The maximum surface temperature of combustion chambers, nozzles, and actively cooled structures is expected to be below 600° C. Each "cycle" of exposure consists of approximately 8 minutes at maximum temperature. The coating is expected to last a minimum of 60 such cycles. For aerospace vehicle applications, the coating is expected to reach 650° C. in oxidizing environments. Each cycle therein consists of approximately 12 minutes at maximum temperature. The coating is expected to last a minimum of 20 such cycles. For gun barrel application, the maximum temperature is estimated to be 650° C. Each cycle therein consists of approximately 2 minutes at maximum temperature. The coating is expected to last a minimum of 10,000 such cycles.

A means of combating the oxidation and any subsequent blanching of copper-based alloys is to coat the surface thereof with a protective coating. Numerous coating materials and protocols for their application to copper-based alloys have been reported. For example, Beers, et al. (U.S. Pat. No. 6,277,499) describe a two-step process for protecting copper and copper-based composites from high temperature oxidation by the application thereto of a cobalt-based alloy diffusion barrier and a copper-aluminum alloy protective outer layer. The procedure disclosed by Beers, et al. involves a first step wherein a diffusion barrier comprising, (1) cobalt, chromium, nickel, carbon, tungsten, and manganese, or (2) cobalt, chromium, carbon, iron, tungsten, and niobium or tantalum, is applied to the surface of the copper-containing substrate by a method such as cathodic arc deposition. In a second step, a protective outer layer comprising Cu—Al (8 wt. % Al) is applied over the diffusion barrier by a method such as cathodic arc deposition.

Likewise, Holmes, et al. (U.S. Pat. No. 6,314,720) describe a rocket combustion chamber coating comprising a protective coating and a transitional layer between the copper-containing combustion chamber surface (lining) and the protective coating. The protective coating may comprise either a metallic or a ceramic material. Metallic compositions described as suitable for the protective coating consist of $R_1$CrAlY, wherein $R_1$ is nickel, cobalt, iron, or a mixture thereof. Suitable ceramic protective coating materials include zirconium oxide stabilized with yttrium oxide, mullite, alumina, zircon, hafnium carbide, hafnium diboride, and hafnium nitride. The transitional layer, as the name suggests, is a layer that comprises both the chamber lining material and the protective coating material, wherein the transitional layer comprises a composition gradient therebetween. In another embodiment, Holmes, et al. describe a process wherein a second protective coating is applied over the first protective coating, with a second transitional layer comprising a composition gradient of the two protective coatings therebetween. In both embodiments the layers are applied using a vacuum plasma spray process.

In addition, Raj (U.S. Pat. No. 6,838,191) discloses blanch-resistant NiAl coatings for copper alloys such as GRCOP-84 (Cu-8 atom % Cr-4 atom % Nb). The coatings described therein comprise a bond coat deposited on the copper alloy and a NiAl topcoat deposited thereover. Suitable bond coats described include Ni, Cu, and Cu—Cr alloys. Bond coats are applied via direct spraying of powder on the copper-alloy substrate or using low pressure or vacuum plasma spray techniques. The NiAl topcoat is deposited using low pressure or vacuum plasma spray.

FIELD OF INVENTION

The present invention generally relates to preventing or minimizing oxidation of copper contained in copper-based alloys by shielding the surface thereof through application of a chromium-containing protective coating thereto. A chromium-containing alloy or a metal alloy treated with a chromium-containing coating undergoes selective oxidation of the surface chromium to $Cr_2O_3$, generally referred to as chromia scale, which forms a protective barrier over the underlying metal alloy. (See, e.g., Wolfa, et al., U.S. Pat. No. 4,124, 737). In practice, this phenomenon is applicable to copper-based alloys (See, e.g., Smith, et al., U.S. Pat. No. 6,491,769).

One methodology for providing a chromium-containing protective layer is described in U.S. Pat. No. 5,557,927, and involves depositing a thin layer of a Cu—Cr compound onto the surface of the copper-based alloy. The coating can be applied, for example, via a vacuum plasma spray or a low temperature arc vapor deposition, as described therein. The coating is deposited to a thickness of about 25 μm. Copper-based alloys coated accordingly demonstrate a significantly improved resistance to oxidation in high temperature environments, as compared to untreated components.

Importantly however, the chromium-containing coating disclosed in U.S. Pat. No. 5,557,927 only provides the requisite oxidation resistance when the chromium content of the coating is at least about 16.5 weight percent. Below this concentration the desired chromia scale is not formed in the relative amounts needed to provide the desired oxidation resistance. In addition, to achieve an acceptable level of oxidation protection the Cu—Cr layer is deposited to a thickness of about 25 μm. By these limitations, the cost associated with the necessary quantity of chromium can be prohibitive. Additionally, in applications such as the SSME propulsion system, the weight of the coating layer reduces the available payload capacity of the rocket. Therefore, a need exists for a lighter protective coating for copper-based alloys containing less chromium.

SUMMARY OF INVENTION

A method of protecting copper-based alloy components is provided wherein an oxidation resistant coating comprising between about 8 weight percent and about 48 weight percent chromium, preferably, between about 8 weight percent and about 16.5 weight percent chromium, and more preferably between about 12 weight percent and about 16.5 weight percent chromium, is applied utilizing electron beam physical vapor deposition (EBPVD) and ion beam assisted deposition (IBAD) techniques. The coatings of the present invention contain nano-structured copper and chromium particles having diameters of less than about 10 nm, which may be deposited as one or more discrete layers each of copper and chromium, or alternatively as one or more layers of a copper-chromium mixture. The coatings provided have a thickness of less than about 25 μm. The so coated copper-containing components exhibit enhanced oxidation resistance at high temperatures.

BRIEF DESCRIPTION OF DRAWINGS

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

The invention may take physical form in certain parts and arrangement of parts. For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by reference to the processes employed in the methods disclosed herein. Electron beam physical vapor deposition (EBPVD) is a known deposition process wherein a focused, high-energy electron beam generated from an electron gun is directed to melt and thermally evaporate a deposition source material. This type of process is described in U.S. Pat. No. 5,391,407, entitled "PROCESS FOR FORMING PROTECTIVE DIAMOND-LIKE CARBON COATINGS ON METALLIC SURFACES," issued on Feb. 21, 1995 to G. Dearnaley, and U.S. Pat. No. 5,501,745, entitled "LOW TEMPERATURE METHOD FOR MAKING A PHOTOVOLTAIC MATERIAL," issued on Mar. 26, 1996 to G. Dearnaley, both of which are herein incorporated by reference in their entireties, to the extent not inconsistent herewith.

Additionally, a process known as ion beam assisted deposition (IBAD) has been described, wherein an energetic beam of ions is generated and directed toward a substrate during a deposition process, thereby imparting certain desired physical characteristics on the deposited layer(s). Such a process is described in U.S. Pat. No. 6,200,649, entitled "METHOD OF MAKING TITANIUM BORONITRIDE COATINGS USING ION BEAM ASSISTED DEPOSITION," issued on Mar. 13, 2001 to G. Dearnaley, and U.S. Pat. No. 5,393,572, entitled "ION BEAM ASSISTED METHOD OF PRODUCING A DIAMOND LIKE CARBON COATING," issued on Feb. 28, 1995 to G. Dearnaley, both of which are herein incorporated by reference in their entireties, to the extent not inconsistent herewith. As described below, EBPVD utilizing IBAD has been found suitable for producing low-chromium, copper-chromium coatings exhibiting excellent oxidation resistance at high temperatures.

Figure 1:
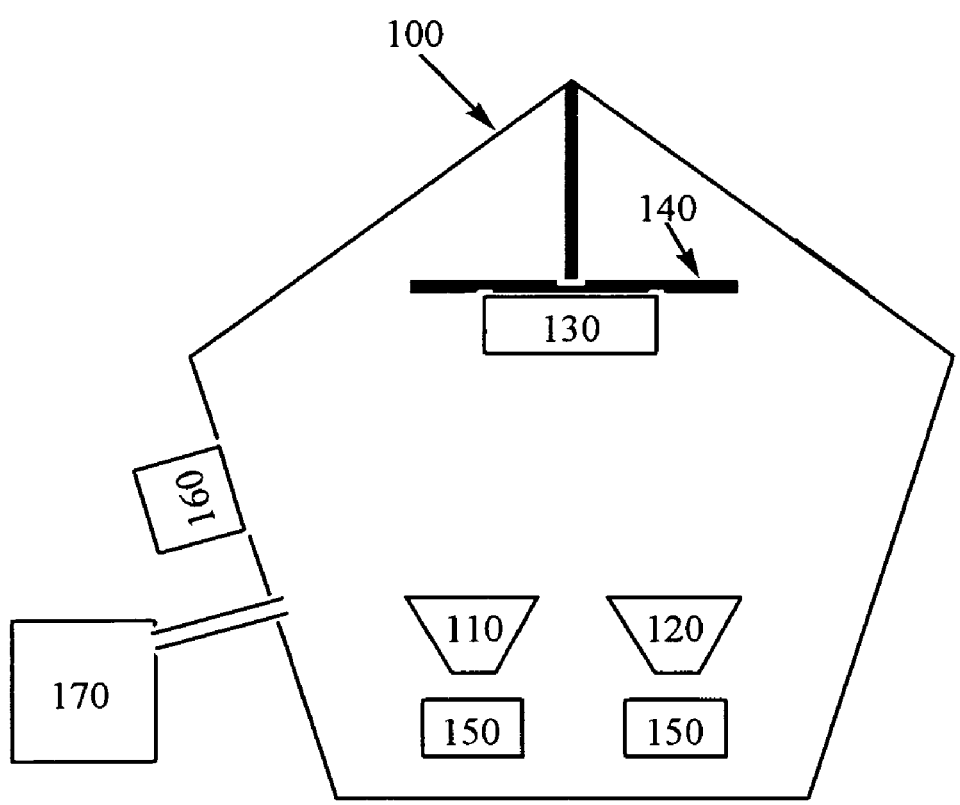
FIG. 1 is a schematic diagram of a dual-gun electron beam vapor deposition system for deposition of nano-structured Cu—Cr coatings.

FIG. 1 depicts one suitable apparatus for depositing the nanostructured Cu—Cr coatings disclosed herein. As shown in FIG. 1, the deposition apparatus includes a vacuum chamber 100 containing metal sources 110 and 120, containing suitable quantities of high purity copper metal and chromium metal, respectively. Also disposed within the vacuum chamber 100 is a substrate holder 140 designed to restrain one or more copper-alloy substrates 130 opposite metal sources 110 and 120. Associated with the vacuum chamber 100 are two or more electron beam sources 150 and one or more ion beam sources 160. The vacuum chamber 100 is equipped with a vacuum source 170 adapted to provide an environment of less than about $5 \times 10^{-5}$ torr.

An electron beam source 150 suitable for use with the present invention is any such device capable of providing sufficient energy to melt and vaporize the metal source 110 or 120 on which its beam is focused, including but not limited to, a 40 cc electron gun, available from Telemark of Fremont, Calif. An ion beam source 160 suitable for use with the present invention is any such device capable of providing a stream of ions which impinge upon substrate(s) 130 during deposition of copper metal and chromium metal thereon, thereby providing the nanostructured coatings disclosed herein, including but not limited to, a radio frequency (RF) fed ion gun such, as one available from AEA Technology PLC of the United Kingdom, and a cold cathode ion source. Suitable ions for use with the present invention include, but are not limited to, argon (Ar), helium (He), neon (Ne), and nitrogen ($N_2$).

In one aspect of the present invention, namely, an alternating deposition process, one or more copper-alloy substrates 130 are placed in substrate holder 140. The vacuum chamber 100 is pumped down to below about $5 \times 10^{-5}$ torr with vacuum source 170. One or more electron beam sources 150 are activated and directed at metal source 110 whereupon the copper metal contained therein is thermally evaporated within the chamber 100. While the vaporization of copper metal is being carried out, one or more ion beam sources 160 are activated and ions produced thereby (e.g., Ar+) are directed at substrate(s) 130 from an angle of about 45 degrees thereto. During this process a layer of copper metal is deposited on substrate(s) 130. Once the deposition of copper metal has resulted in a layer thereof having a desired thickness, the activated electron beam source(s) 150 are deactivated and one or more other electron beam sources 150 are activated and directed at metal source 120, whereupon the chromium metal contained therein is thermally evaporated within the chamber 100. During this step a layer of chromium metal is deposited over the previously deposited copper layer covering substrate(s) 130. Once the deposition of chromium metal has resulted in a layer thereof having a desired thickness, the activated electron beam source(s) 150 are deactivated. The depositions of copper and chromium are alternatingly performed in this manner until a desired number of layers of each have been so deposited. The thicknesses of the metal layers may be measured with a quartz crystal monitor (not shown) having a precision of <1 nm.

In another aspect of the invention, namely, a co-deposition process, one or more layers containing both copper and chromium are deposited on the substrate(s) 130. In one embodiment thereof, rather than performing an alternating sequence of copper and chromium depositions, two or more electron beam sources 150 are activated substantially simultaneously to vaporize both metal source 110 and metal source 120 concurrently, thereby depositing a layer comprising both copper atoms and chromium atoms onto substrate(s) 130. Importantly, although two metal sources 110 and 120 are depicted in FIG. 1, an apparatus useful in practicing the present invention may comprise more than two metal sources. In another embodiment, a Cu—Cr co-deposition may be achieved by utilizing one or more metal sources comprising Cu—Cr mixtures (not shown). In such an embodiment, a layer containing a Cu—Cr mixture may be deposited by directing one or more electron beam sources 150 at the Cu—Cr metal source. In all embodiments of the co-deposition process, ion beams are directed at the substrate(s) 130 during the deposition process, as described above for the alternating deposition process. Once a composite Cu—Cr layer has been co-deposited on substrate(s) 130, additional such composite Cu—Cr layers may be deposited thereover.

EXAMPLE 1

In one embodiment of the alternating deposition process described above, a substrate 130 consisting of GRCOP-84 (Cu-8 atom % Cr-4 atom % Nb) was secured in substrate holder 140. The vacuum chamber 100 was pumped down to below about $5 \times 10^{-5}$ torr with vacuum source 170. Before deposition was commenced, the substrate surface was sputter cleaned for 10 minutes using 75 watt Ar+ ion at 2 KeV. One electron beam source 150 directed at metal source 110 was activated utilizing a beam voltage of 8.0 KeV. Substantially simultaneously, one ion beam source 160 was activated and a beam of ions produced thereby was directed at substrate 130 from an angle of about 45 degrees thereto. The ion beam was generated at 75 W (20 mA, 2 KeV), and consisted of 2.5 sccm poly cold (−63.1° C.) Ar+ ions. A layer of copper (about 100 nm) was deposited thereby onto substrate 130. Thereafter, the activated electron beam source 150 was deactivated and a second ion beam source 150, directed at metal source 120, was activated utilizing a beam voltage of 8.0 KeV. A layer of chromium (about 22 nm) was deposited thereby over the copper layer previously deposited onto substrate 130. This sequence was repeated and by this alternating process 18 layers each of copper and chromium were deposited onto substrate 130.

In this embodiment, a copper and chromium coating having a chromium content of about 15 weight percent was realized. In other embodiments, the chromium content was varied from about 8 weight percent to about 48 weight percent by adjusting the thickness of the chromium layers deposited. Additionally, the number of layers of each metal was varied from 15 layers to 19 layers. It would be appreciated by one skilled in the art, however, that the number of layers deposited is not limited to this range, but may be varied to achieve the desired physical properties of the coated surface. It would further be appreciated by one skilled in the art that both the absolute and relative thicknesses of the metal layers may be adjusted within and without these ranges to achieve the desired physical properties of the coated surface. Some embodiments of the alternating deposition process are shown in Table 1 below.

TABLE 1

| Coating Composition (wt. %) | Cu Layer Thickness | Cr Layer Thickness | No. of Layers Deposited |
|---|---|---|---|
| 90% Cu-10% Cr | 100 nm | 14 nm | 19 |
| 85% Cu-15% Cr | 100 nm | 22 nm | 18 |
| 80% Cu-20% Cr | 100 nm | 31 nm | 16 |
| 75% Cu-25% Cr | 100 nm | 42 nm | 15 |

EXAMPLE 2

In one embodiment of the co-deposition process described above, a substrate 130 consisting of GRCOP-84 (Cu-8 atom % Cr-4 atom % Nb) was secured in substrate holder 140. The vacuum chamber 100 was pumped down to below about $5.5 \times 10^{-5}$ torr with vacuum source 170. Before deposition was commenced, the substrate surface was sputter cleaned for 15 minutes using 100 watt Ar+ ion at 2 KeV. Two electron beam sources 150, utilizing a beam voltage of 7.5 KeV each, were activated and directed separately at metal sources 110 and 120, whereupon the copper metal and chromium metal, respectfully, contained therein was thermally evaporated within the chamber 100. Substantially simultaneously, one ion beam source 160 was activated and a beam of ions produced thereby was directed at substrate 130 from an angle of about 45 degrees thereto. The ion beam was generated at 100 W (20 mA, 2 KeV), and consisted of 2.8 sccm poly cold (−63.1° C.) Ar+ ions. The deposition of Cu and Cr was controlled whereby the Cu deposition rate was about 7 Å per second and the Cr deposition rate was about 3 Å per second. After a composite Cu—Cr layer having a thickness of about 10 μm was so deposited, the electron beam source 150 directed at metal source 110 was deactivated and a Cr "capping" layer having a thickness of about 1000 Å was deposited over the composite Cu—Cr layer.

It would be appreciated by one skilled in the art that the relative amounts of copper and chromium contained in such a composite layer, the number of such composite layers deposited, the thickness(es) thereof, and the thickness of an optional chromium capping layer may be varied to achieve the desired physical properties of the composite coated surface. Further, it would be understood by one skilled in the art that coating thickness is related to useful life and the total coating thickness may be varied to achieve the desired oxidation resistance and durability. Coatings produced by various embodiments of the present invention define a total thickness of from about 2.5 μm to about 25 μm.

In addition, the copper-alloy substrate(s) 130 may comprise a material other than the GRCOP-84 (Cu-8 atom % Cr-4 atom % Nb) material described above. Embodiments of the present invention include deposition on NARLOY-Z (Cu-3 wt. % Ag-0.5 wt. % Zr), however, further embodiments can be envisioned wherein suitable substrates consist of pure copper or other copper-containing alloys. As would be appreciated by one skilled in the art, any copper-containing substrate for which it would be desirable to diminish copper oxide formation may be suitable for employment of the present invention.

In still another aspect, one or more alternating deposition sequences and one or more co-depositions may be performed sequentially to produce a coating containing Cu, Cr, and Cu—Cr layers. In addition, in another embodiment, one or more co-depositions may comprise varying the relative rates of deposition of the two or more metals during deposition. By varying these deposition rates, a layer comprising varying relative amounts of metals, e.g., of copper and chromium, may be deposited. In this manner a layer comprising a gradient composition of copper and chromium may be deposited. It would be within the expertise of one skilled in the art to optimize the combination of these processes to achieve the desired physical properties of the coated surface.

Additionally, the present invention is not limited to the deposition of coatings containing essentially only copper and chromium. While substantially pure copper and pure chromium metal sources may be employed, both alternating deposition and co-deposition as described herein may be performed using metal sources containing metals other than copper and chromium. Specifically, a substantially chromium-free copper source utilized may contain one or more metals other than copper, a substantially copper-free chromium source utilized may contain one or more metals other than chromium, and a Cu—Cr metal source may contain one or more metals other than copper and chromium. One skilled in the art would appreciate the benefits of depositing coatings containing other metals and have the expertise to vary the metals employed to achieve the desired physical properties of the coated surface.

Figure 2:
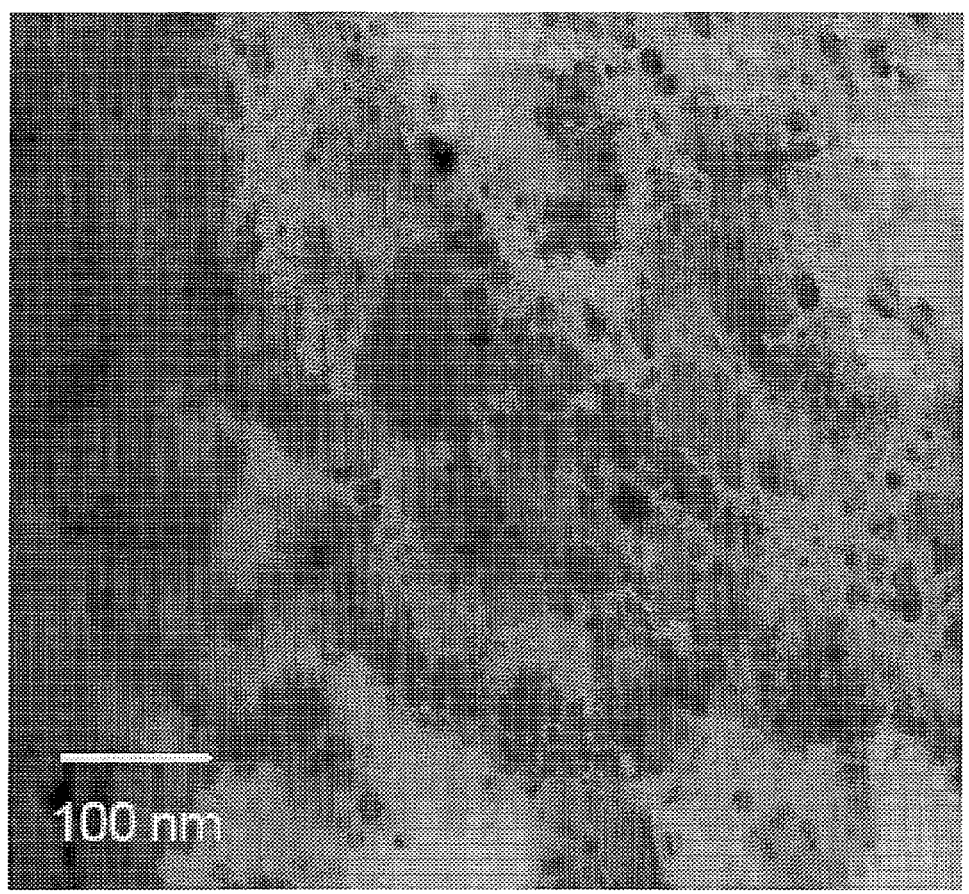
FIG. 2 is a transmission electron micrograph of a GRCOP-84 (Cu-8 atom % Cr-4 atom % Nb) substrate coated with Cu—Cr (85 wt. % Cu-15 wt. % Cr) using ion beam assisted electron beam vapor alternating deposition, showing the nanostructure of the coating.

FIG. 2 shows a transmission electron micrograph of a Cu—Cr (85 wt. % Cu-15 wt. % Cr) coated copper-alloy (GRCOP-84 (Cu-8 atom % Cr-4 atom % Nb))surface created by electron beam vapor alternating deposition showing the nanostructure of the coating. As shown in FIG. 2, the Cu and Cr particle sizes observed have diameters of <10 nm. Previously described Cu—Cr coatings have been reported to contain metal particles having a diameter of from about 0.1-10 μm. Not to be bound by theory, it is believed that the IBAD process effects this particle size diminutization.

Figure 3:
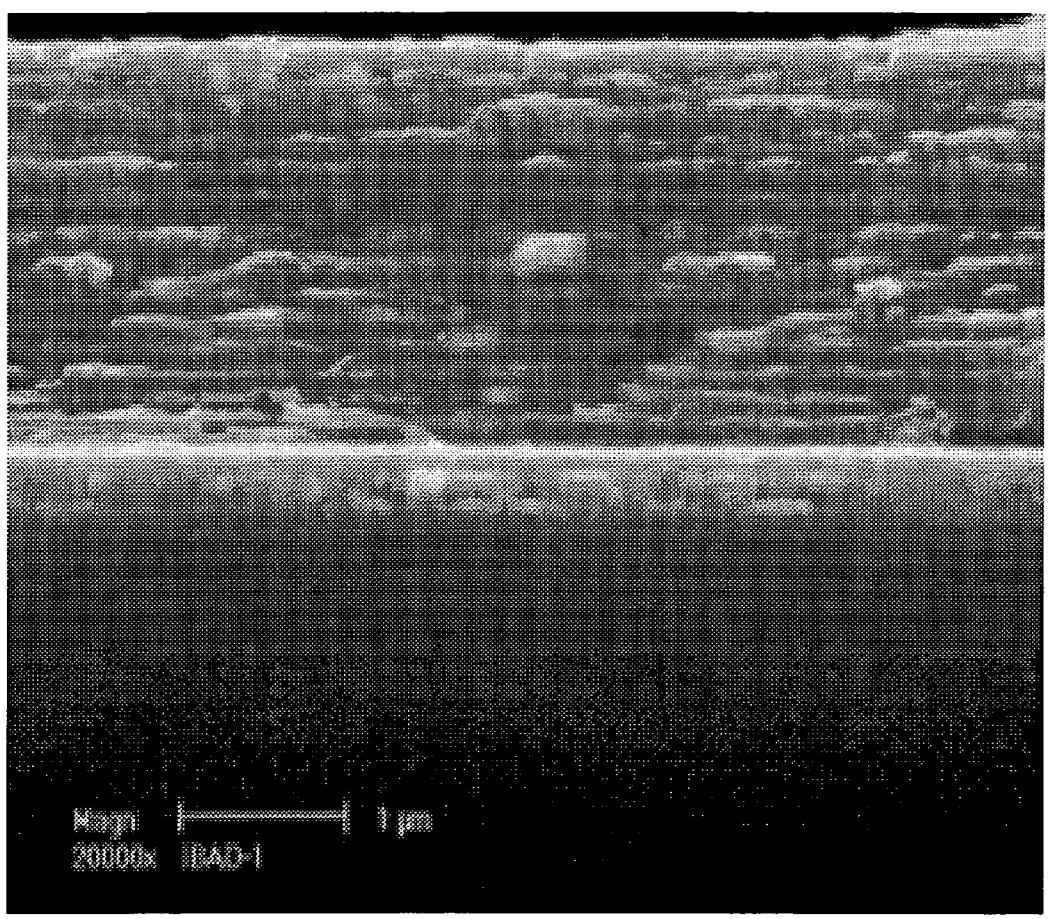
FIG. 3 is a scanning electron micrograph side view of the surface of the GRCOP-84 (Cu-8 atom % Cr-4 atom % Nb) substrate coated with Cu—Cr (85 wt. % Cu-15 wt. % Cr) using ion beam assisted electron beam vapor alternating deposition shown in FIG. 2.

FIG. 3 show a scanning electron micrograph side view of the surface of the GRCOP-84 (Cu-8 atom % Cr-4 atom % Nb) substrate coated with Cu—Cr (85 wt. % Cu-15wt. % Cr) using ion beam assisted electron beam vapor alternating deposition shown in FIG. 2. Observable therein are the discrete alternating layers of Cu and Cr. As indicated by the scaling legend, the overall coating thickness is less than about 5 μm.

Figure 4:
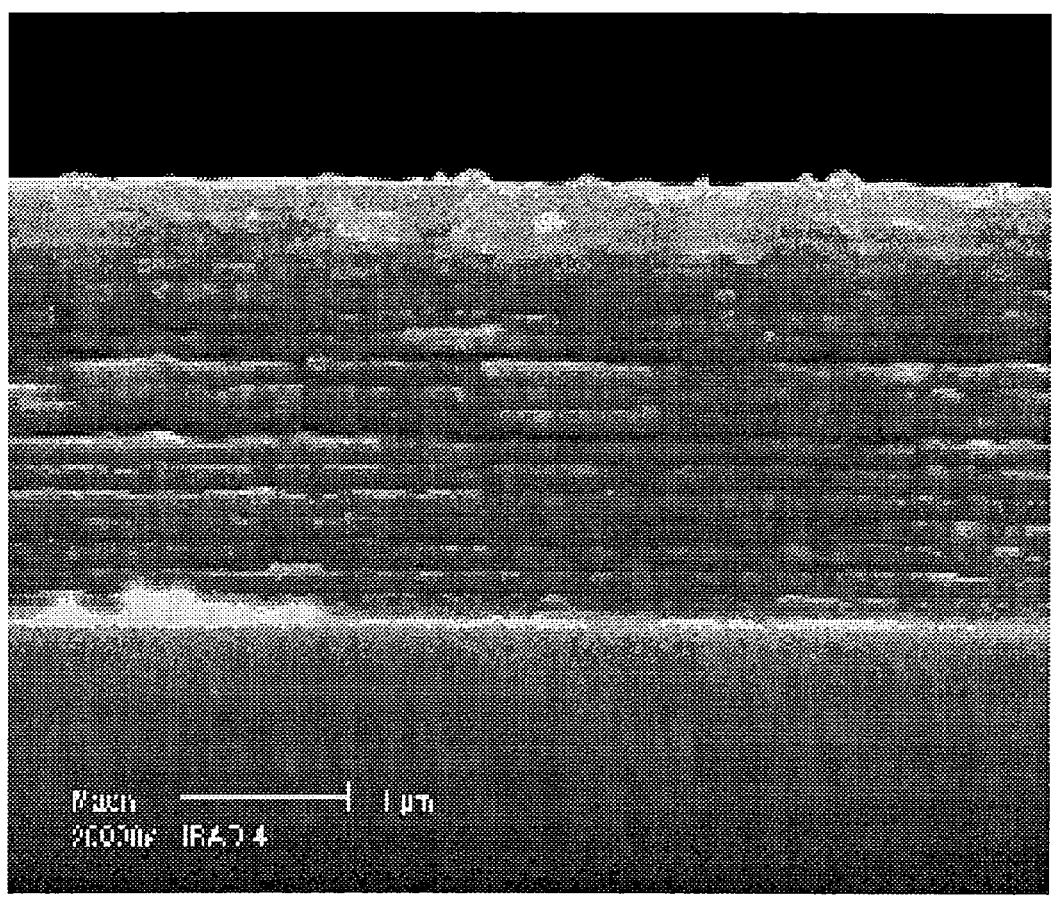
FIG. 4 is a scanning electron micrograph side view of the surface of a GRCOP-84 (Cu-8 atom % Cr-4 atom % Nb) substrate coated with Cu—Cr (90 wt. % Cu-10 wt. % Cr) using ion beam assisted electron beam vapor alternating deposition.
Figure 5:
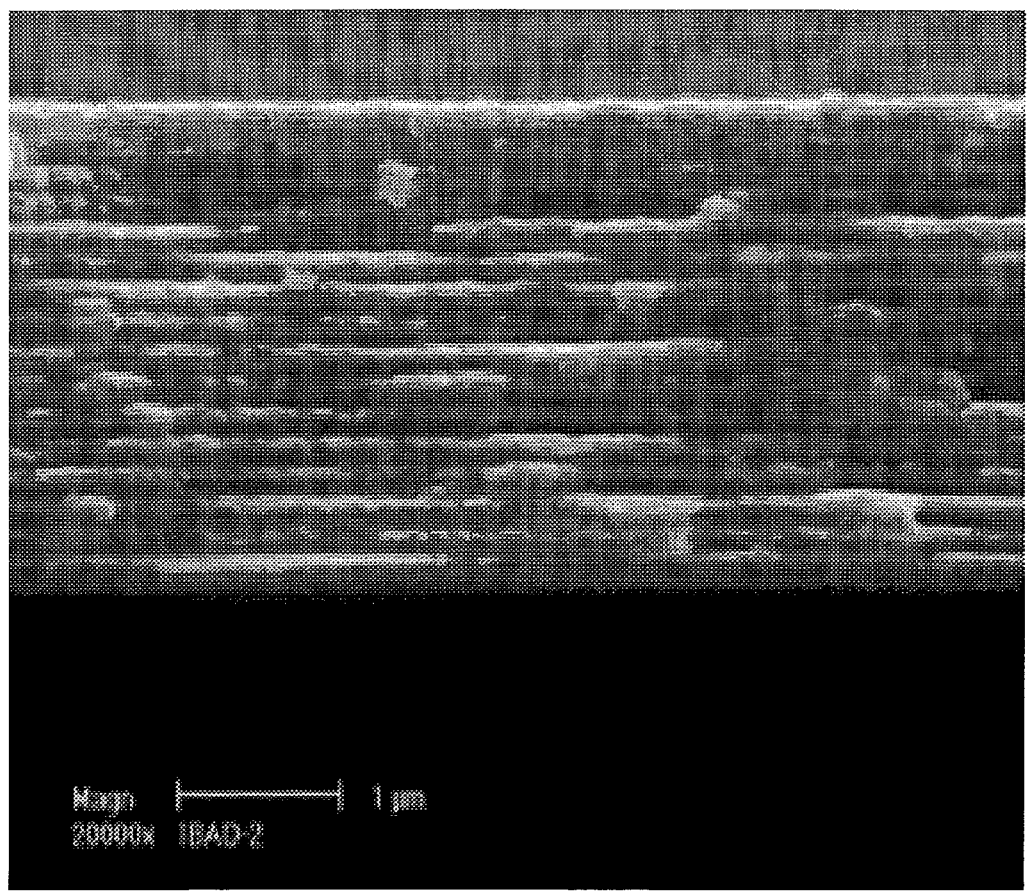
FIG. 5 is a scanning electron micrograph side view of a GRCOP-84 (Cu-8 atom % Cr-4 atom % Nb) substrate coated with Cu—Cr (80 wt. % Cu-20 wt. % Cr) using ion beam assisted electron beam vapor alternating deposition.
Figure 6:
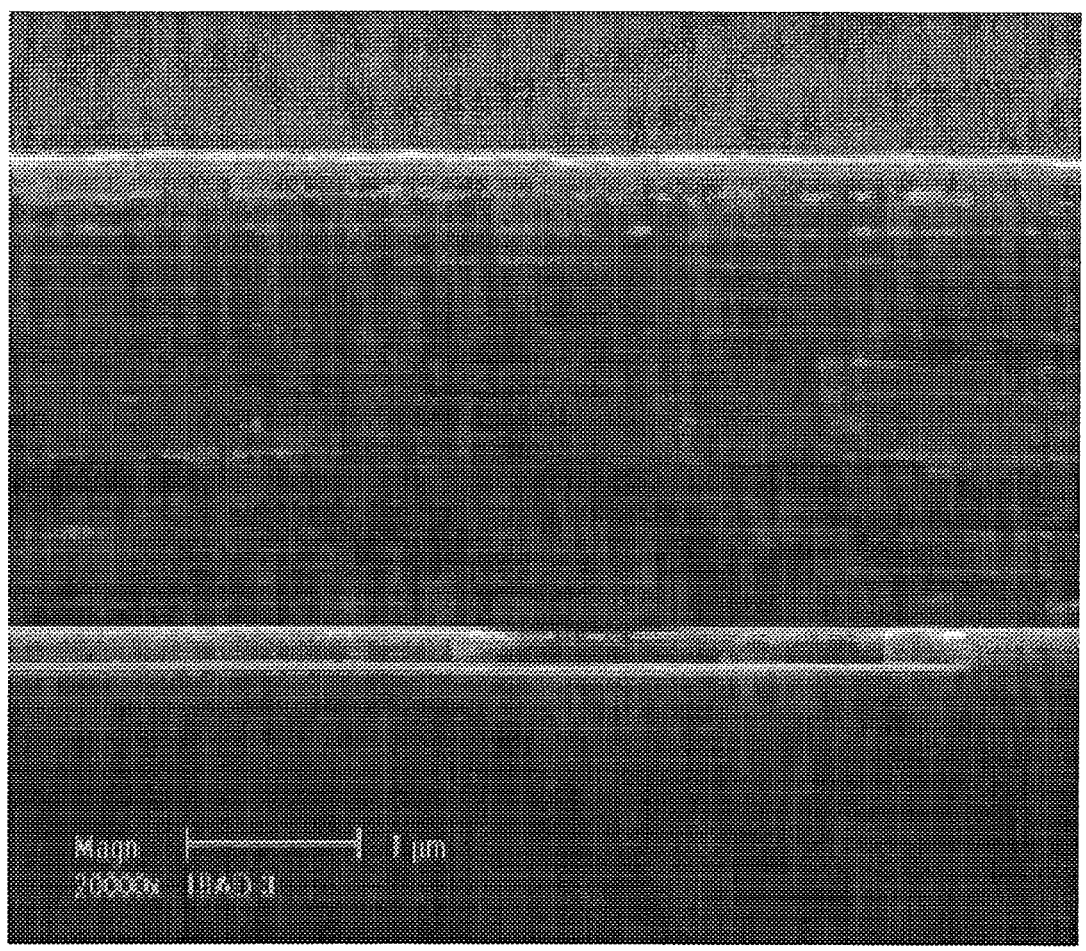
FIG. 6 is a scanning electron micrograph side view of a GRCOP-84 (Cu-8 atom % Cr-4 atom % Nb) substrate coated with Cu—Cr (75 wt. % Cu-25 wt. % Cr) using ion beam assisted electron beam vapor alternating deposition.

FIGS. 4, 5, and 6 show scanning electron micrograph side views of the surfaces of GRCOP-84 (Cu-8 atom % Cr-4 atom % Nb) substrates coated with Cu—Cr using ion beam assisted electron beam vapor alternating deposition, having coating compositions of 90 wt. % Cu-10 wt. % Cr, 80 wt. % Cu-20 wt. % Cr, and 75 wt. % Cu-25 wt. % Cr, respectively.

Figure 7:
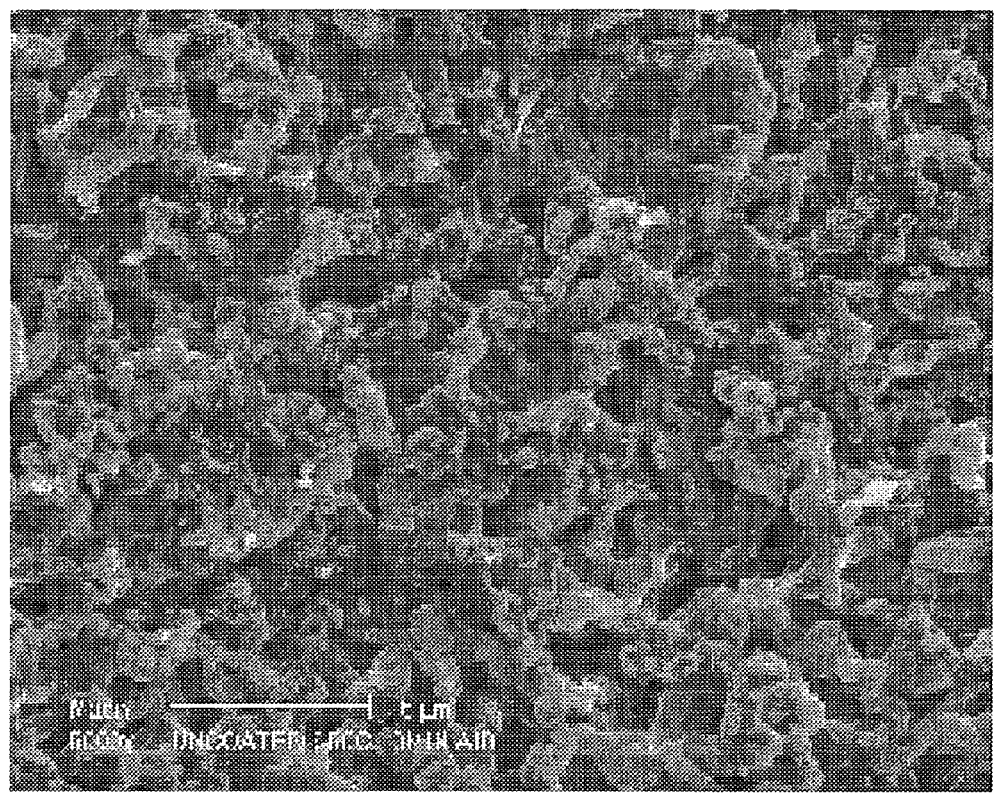
FIG. 7 is a scanning electron micrograph of the surface of an uncoated GRCOP-84 (Cu-8 atom % Cr-4 atom % Nb) substrate after oxidation in air for 10 minutes at 650°C.

FIG. 7 shows a scanning electron micrograph of the surface of an uncoated copper-alloy GRCOP-84 (Cu-8 atom % Cr-4 atom % Nb)) substrate after oxidation in air for 10 minutes at 650° C. The porous, irregular surface topography of the untreated copper-alloy is indicative of oxidized copper ($Cu_xO_y$) which is well known to diminish the thermal conductivity and coefficient of thermal expansion of the copper-containing substrate. In addition, the copper oxides formed by alloy oxidation reduce the effective thickness of the substrate structure and its load carrying capability.

Figure 8:
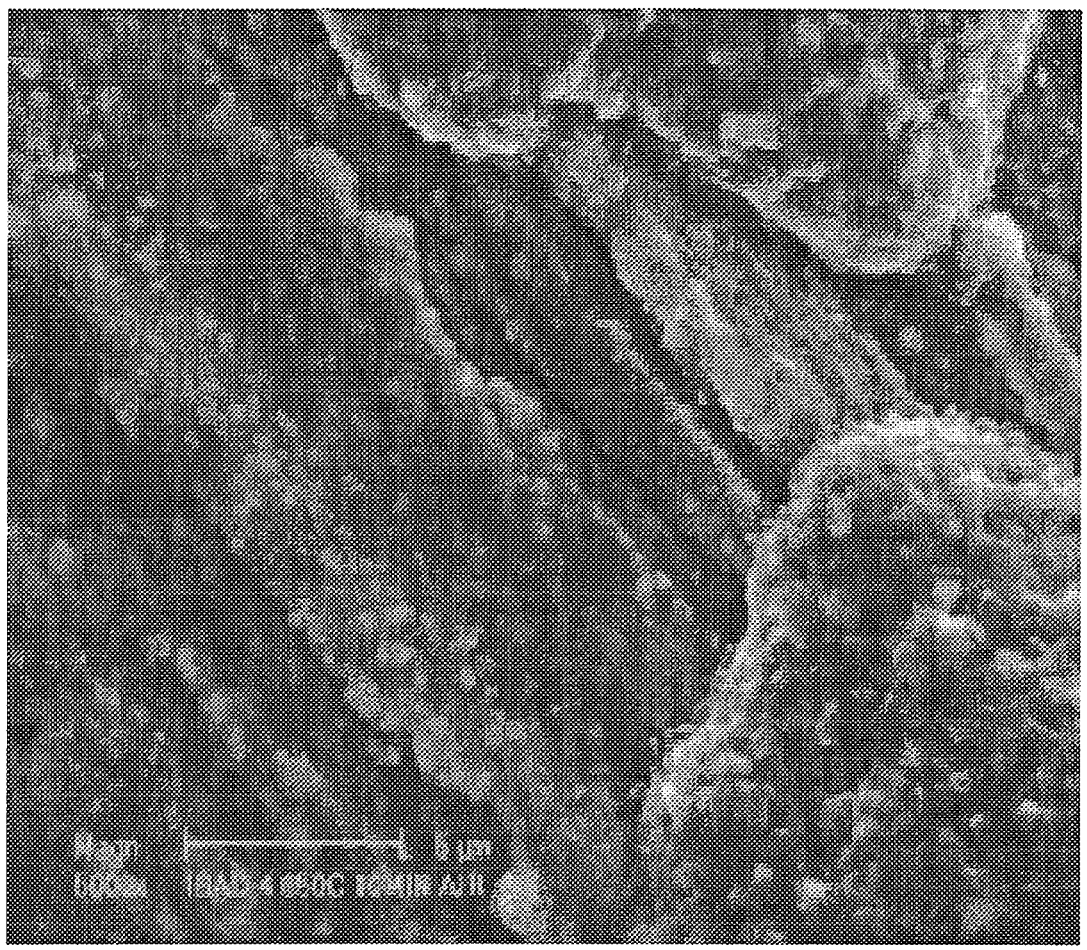
FIG. 8 is a scanning electron micrograph of the GRCOP-84 (Cu-8 atom % Cr-4 atom % Nb substrate coated with Cu—Cr (90 wt. % Cu-10 wt. % Cr) using ion beam assisted electron beam vapor alternating deposition shown in FIG. 4 after oxidation in air for 10 minutes at 650°C.
Figure 9:
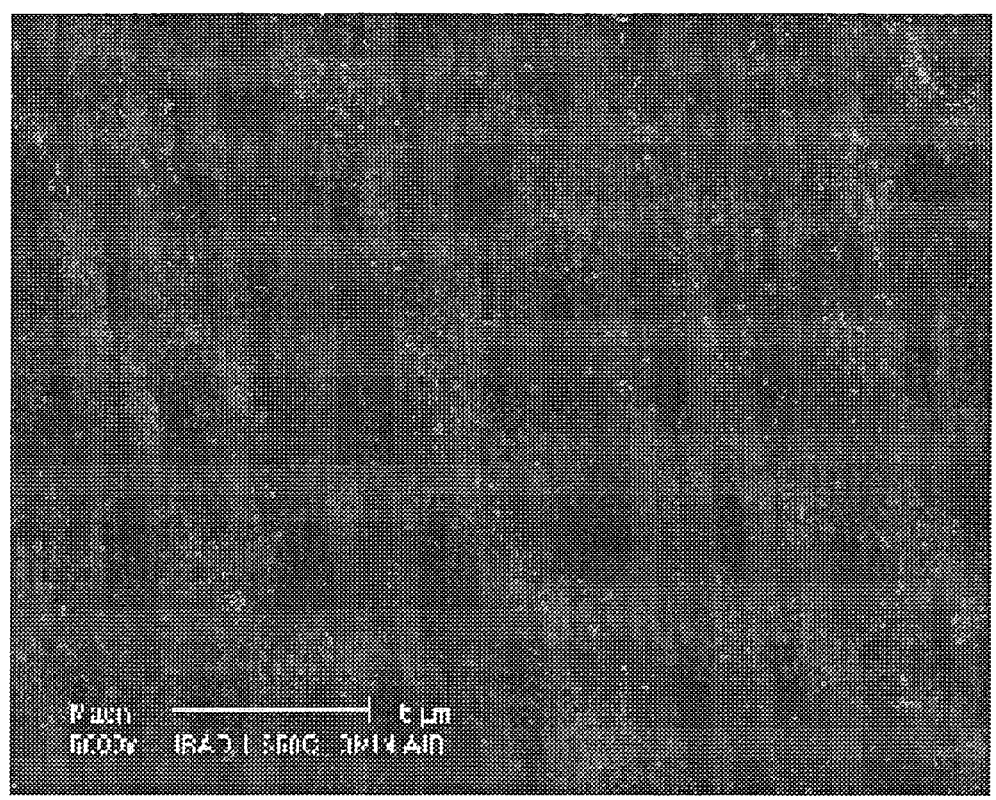
FIG. 9 is a scanning electron micrograph of the surface of the GRCOP-84 (Cu-8 atom % Cr-4 atom % Nb) substrate coated with Cu—Cr (85 wt. % Cu-15wt. % Cr) using ion beam assisted electron beam vapor alternating deposition shown in FIGS. 2 and 3 after oxidation in air for 10 minutes at 650°C.
Figure 10:
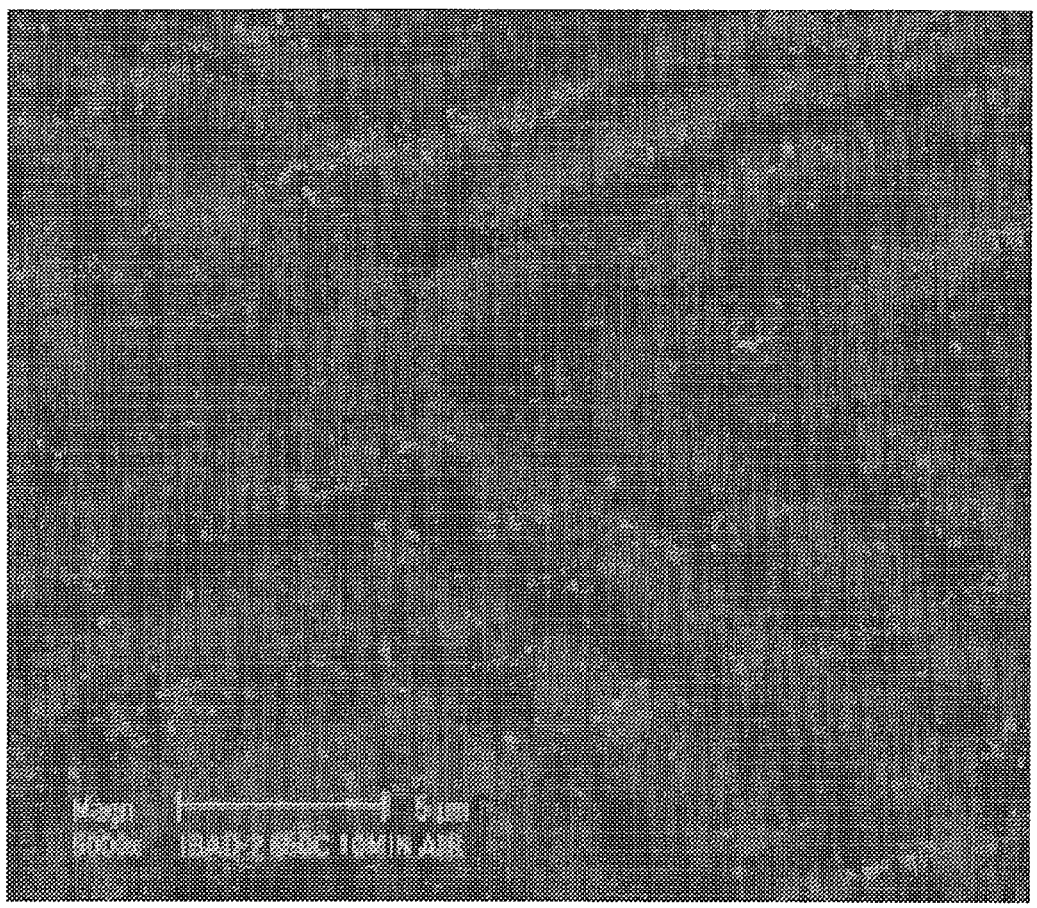
FIG. 10 is a scanning electron micrograph of the GRCOP-84 (Cu-8 atom % Cr-4 atom % Nb) substrate coated with Cu—Cr (80 wt. % Cu-20 wt. % Cr) using ion beam assisted electron beam vapor alternating deposition shown in FIG. 5 after oxidation in air for 10 minutes at 650°C.

FIGS. 8, 9, and 10 show the surface morphology of various GRCOP-84 (Cu-8 atom % Cr-4 atom % Nb) substrates coated with nanostructured Cu—Cr via alternating deposition, after air oxidation for 10 minutes at 650° C. The surfaces of these specimens may be compared to the thick external Cu-oxides observable in the untreated substrate as depicted in FIG. 7. As seen in FIG. 8, an oxygen exposed 90 wt. % Cu-10 wt. % Cr coating exhibits an uneven array of Cr-rich oxides interspersed with nodules of Cu-rich oxides. In contrast, the 85 wt. % Cu-15 wt. % Cr and 80 wt. % Cu-20 wt. % Cr coated surface shown in FIGS. 9 and 10, respectively, display a pattern of fine-grained, protective chromium-rich oxides. Similar surface morphology was also observed for the 75 wt. % Cu-25 wt. % Cr coating. These results show that a Cr content of somewhere between about 10 wt. % and 15 wt. % is needed for optimum external protective chromia scale formation.

Coated substrates were also exposed to an oxidative environment for longer time periods. Oxide formation on the coated substrate was quantified by weight differential of the sample as measured with a Cahn TherMax 700 Thermogravimetric Analyzer (TGA) (available from the ThermoCahn, Newington, N.J.). In one study, a NARLOY-Z (Cu-3 wt. % Ag-0.5 wt. % Zr) substrate coated according to the present invention was subjected to long-term exposure in an oxidative environment. In an apparatus utilizing this TGA, the sample was heated to a steady-state temperature of 650° C. in 16 minutes. Within the apparatus, the specimen was continuously monitored for temperature and mass change over a period of 3 hours.

Figure 11:
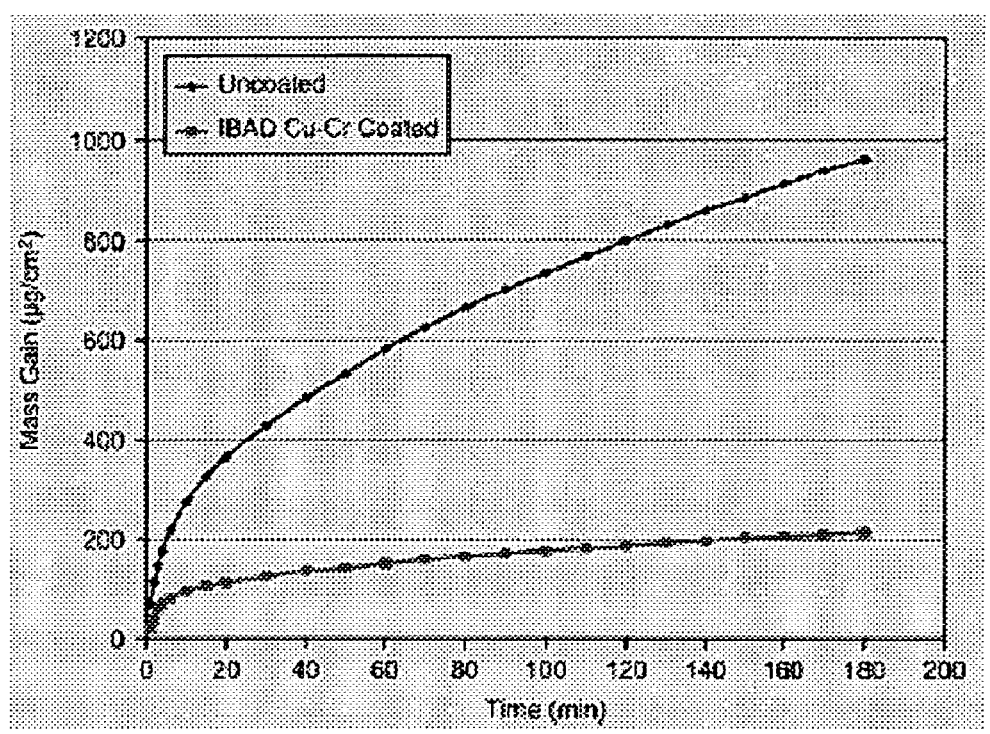
FIG. 11 is a graphic representation of the oxidation rates of an uncoated NARLOY-Z (Cu-3 wt. % Ag-0.5 wt. % Zr) substrate and a Cu—Cr coated (85.6 wt. % Cu-14.4 wt. % Cr) NARLOY-Z (Cu-3 wt. % Ag-0.5 wt. % Zr) substrate (ion beam assisted electron beam vapor co-deposition) at 650° C., plotting mass change as a function of exposure time.

FIG. 11 shows a graph comparing the oxidation rates of an uncoated NARLOY-Z (Cu-3 wt. % Ag-0.5 wt. % Zr) substrate and a Cu—Cr coated (85.6 wt. % Cu-14.4 wt. % Cr) NARLOY-Z (Cu-3 wt. % Ag-0.5 wt. % Zr) substrate at 650° C., under the conditions described above, wherein mass change is plotted against exposure time. The Cu—Cr coating was applied using ion beam assisted electron beam vapor co-deposition to a total coating thickness of about 5 µm. As shown in FIG. 11, both specimens exhibited more rapid oxidation rates during an initial transient period of approximately 6 minutes, but experienced slower oxidation rates at longer times. Over a 3 hour period, the Cu—Cr coated substrate experienced only about 20% as much oxidation as the untreated NARLOY-Z (Cu-3 wt. % Ag-0.5 wt. % Zr. Not to be bound by theory, it is believed that the much finer grain size yielded by the ion beam assisted deposition promotes the selective oxidation of chromium, resulting in the formation of protective chromia scale at lower chromium levels. Based on oxidation kinetics calculations, it is further theorized that the oxidation rate of the untreated NARLOY-Z (Cu-3 wt. % Ag-0.5 wt. % Zr) is controlled by outward diffusion of Cu ions to form external Cu-oxide. In contrast, oxidation of the Cu—Cr coating surface is controlled by outward diffusion of chromium ions to form protective $Cr_2O_3$ scales.

Figure 12:
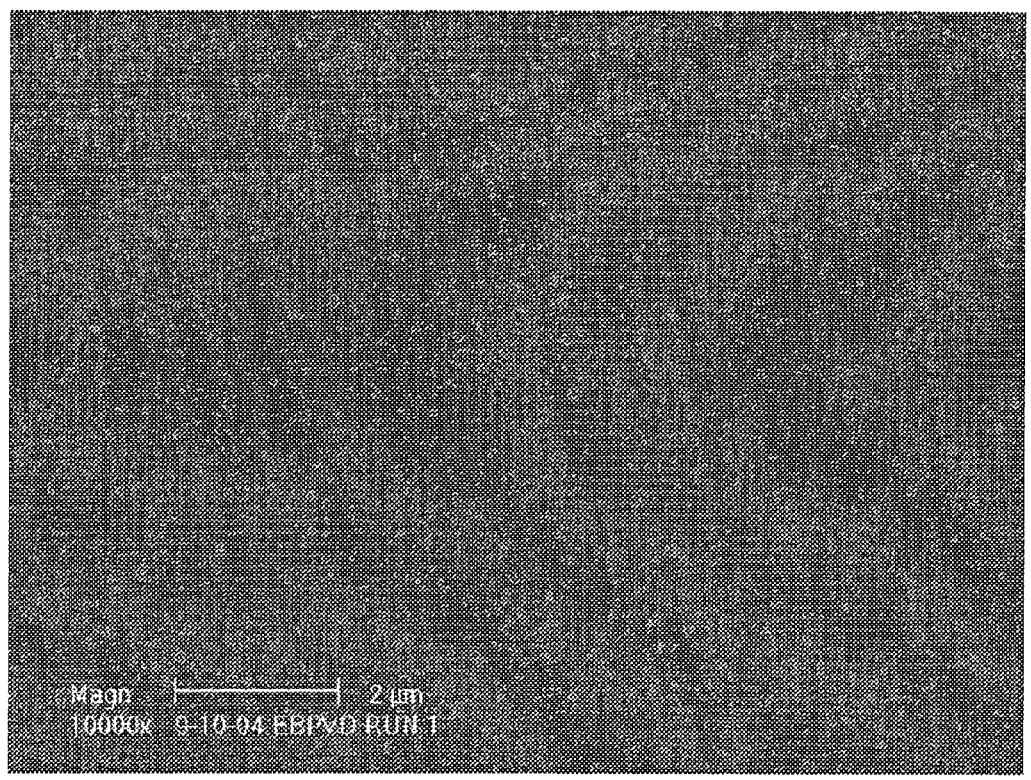
FIG. 12 is a scanning electron micrograph of a GRCOP-84 (Cu-8 atom % Cr-4 atom % Nb substrate coated with Cu—Cr (85 wt. % Cu-15 wt. % Cr) using ion beam assisted electron beam vapor co-deposition.
Figure 13:
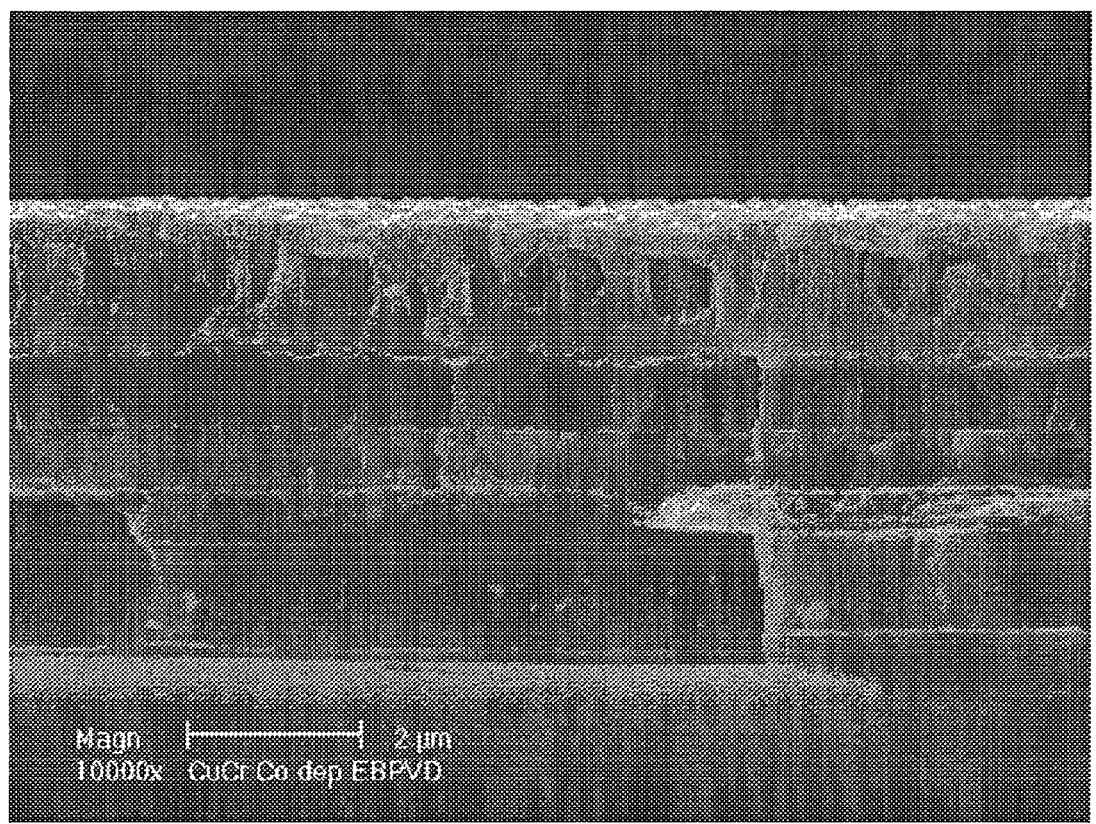
FIG. 13 is a scanning electron micrograph side view of the GRCOP-84 (Cu-8 atom % Cr-4 atom % Nb) substrate coated with Cu—Cr (85 wt. % Cu-15 wt. % Cr) using ion beam assisted electron beam vapor co-deposition shown in FIG. 12.

FIG. 12 shows a scanning electron micrograph of a GRCOP-84 (Cu-8 atom % Cr-4 atom % Nb) substrate coated with Cu—Cr (85 wt. % Cu-15 wt. % Cr) using ion beam assisted electron beam vapor co-deposition. In this example a Cr "capping" layer having a thickness of about 1000 Å was deposited over the co-deposited Cu—Cr layer. FIG. 13 shows a side view of the coated substrate shown in FIG. 12. The coating depicted therein has an overall thickness of about 5.2 µm.

The chromium-containing coatings of the present invention display excellent oxidation resistance under high temperature oxidative conditions. As these coatings perform as well as previously described coatings requiring greater layer thickness and higher levels of chromium, benefits can be realized from employment of the present invention. In addition, the flexibility of the deposition methods disclosed herein allow for customization of the process to fit individual requirements of a variety of applications.

Although the present invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other methods for carrying out the same purposes of the present invention. It should also be realized by those skilled in the art that such equivalent processes do not depart from the spirit and scope of the invention as set forth in the appended claims.

It is therefore, contemplated that the claims will cover any such modifications or embodiments that fall within the true scope of the invention.

What is claimed is:

1. A method for protecting a copper-based alloy component against high temperature oxidation, comprising the steps of:
   (a) placing the copper-based alloy component in a chamber adapted to function at reduced pressures including a copper metal source, a chromium metal source, an electron beam source and an ion beam source;
   (b) evacuating the chamber to provide a partial vacuum therein; and
   (c) vapor depositing said copper metal source or said chromium metal source by said electron beam and activating said ion beam source and directing ions at said copper-based alloy component and forming a coating on the copper-based alloy component,
   wherein the coating has a total thickness of less than about 10 µm and comprises alternating layering of at least one substantially chromium-free layer comprising copper and at least one substantially copper-free layer comprising chromium;
   wherein the chromium content of the coating is greater than about 8 weight percent and less than 16.5 weight percent and wherein the copper and chromium particles deposited on the copper-based alloy component are of a diameter less than about 10 nm, wherein said Cu—Cr coating in the presence of oxygen over a period of three hours or less has a mass gain of less than or equal to about 200 micrograms per square centimetre at 650° C.

2. The method of claim 1, wherein the coating comprises at least one layer comprising a copper copper-chromium mixture.

3. The method of claim 2, wherein a capping layer consisting substantially of copper-free chromium is deposited over the final copper-chroimium mixture layer deposited.

4. The method of claim 2, wherein vapor depositing one or more of the at least one layer comprising a copper-chromium mixture comprises varying the relative amounts off copper and chromium during the deposition, thereby producing one or more layers containing varying relative amounts of copper and chromium.

5. The method of claim 1, wherein the copper-based alloy component comprises a substance selected from the group consisting of Cu-8 atom % Cr-4 atom % Nb and Cu-3 wt. % Ag-5 wt. % Zr.

6. The method of claim 1, wherein the partial vacuum provided within the chamber is less than about $5\times10^{-5}$ torr.

7. The method of claim 1, wherein the chroium coating is between at least about 12 weight percent and less than 16.5 weight percent.

8. The method of claim 1, wherein the coating comprises multiple discrete layers comprising substantially chromium-free copper and substantially copper-free chromium deposited alternatingly on the copper-based alloy component.

9. The method of claim 8, wherein the coating comprises at least 8 discrete layers each of substantially chromium-free copper and substantially copper-free chromium.

10. The method of claim 1, wherein the ion source for the ion beam is argon.

11. A method for coating a copper-based alloy component by a co-deposition of copper and chromium, comprising the steps of:

(a) placing the copper-based alloy component in a chamber adapted to function at reduced pressures, wherein the chamber contains two or more metal sources and an electron beam source and an ion beam source;

(b) evacuating the chamber to provide a partial vacuum therein; and (c) depositing a coating having a total thickness of less than about 10 μm and containing alternating layers of at least one substantially chromium-free layer comprising copper and at least one substantially copper-free layer comprising chromium on the copper-based alloy component by said electron beam source and directing ions at said copper-based alloy component, wherein the two or more of the metal sources utilized for the co-deposition are a substantially copper-free metal source comprising chromium and a substantially chromium-free metal source comprising copper; and wherein the copper and chromium particles comprising the coating are of a diameter of less than about 10 nm, wherein the chromium content of the coating is greater than about 8 weight percent and less than 16.5 weight percent and wherein said Cu—Cr coating in the presence of oxygen over a period of three hours or less has a mass gain of less than or equal to about 200 micrograms per square centimetre at 650° C.

* * * * *